United States Patent [19]

Okuhira et al.

[11] Patent Number: 4,693,779
[45] Date of Patent: Sep. 15, 1987

[54] MANUFACTURING APPARATUS FOR SEMICONDUCTOR DEVICES

[75] Inventors: Hidekazu Okuhira, Kokubunji; Yasuo Wada, Bunkyo, both of Japan

[73] Assignee: Hitachi, Ltd., Tokyo, Japan

[21] Appl. No.: 798,113

[22] Filed: Nov. 14, 1985

[30] Foreign Application Priority Data

Nov. 14, 1984 [JP] Japan ................................ 59-238570

[51] Int. Cl.$^4$ .............................................. C23F 1/02
[52] U.S. Cl. ..................................... 156/638; 156/345; 156/643; 156/646; 156/666
[58] Field of Search ............... 156/643, 345, 646, 666, 156/664, 635, 638; 219/121 LS, 121 LH, 121 LK

[56] References Cited

U.S. PATENT DOCUMENTS 4,427,723 1/1984 Swain ............................ 219/121 LS
4,490,210 12/1984 Chen et al. ...................... 156/664 X

FOREIGN PATENT DOCUMENTS 0037733 2/1985 Japan .................................. 156/345

Primary Examiner—Arthur Kellogg
Attorney, Agent, or Firm—Antonelli, Terry & Wands

[57] ABSTRACT

A semiconductor device manufacturing apparatus is disclosed which comprises a reaction chamber; at least one light source for radiating light to a wafer disposed in the reaction chamber and performing plural processes by the photo-assisted reactions; a gas introducing means for introducing gaseous reactants into the reaction chamber; a gas exhausting means for exhausting the interior of the reaction chamber; and a light source for removing by light irradiation undesirable gaseous constituents which adhered to the wafer and the chamber inner wall in the preceding step. Since undesirable gaseous constituents adhered to the wafer and thereabouts can be removed, it is possible to effect plural processes for the wafer in the same chamber.

8 Claims, 4 Drawing Figures

MANUFACTURING APPARATUS FOR SEMICONDUCTOR DEVICES

BACKGROUND OF THE INVENTION

The present invention relates to a manufacturing apparatus for semiconductor devices and more particularly to a novel semiconductor device manufacturing apparatus capable of effecting plural processes by utilizing photo-assisted reactions within a single chamber.

In a photo-assisted process, by selecting appropriate gaseous reactants and a light source of an appropriate wave length, there are induced a gas phase reaction of gaseous reactant molecules, reaction of adsorbed species and wafer, heating of wafer, etc. and there can be performed film deposition onto wafer, etching, impurity doping into film and cleaning of the wafer surface.

McWilliams et al have combined various gaseous reactants with an argon ion laser and performed plural processes at a raised temperature by moving a substrate while focusing an argon ion laser light on the surface of the substrate, thereby formed a MOS transistor [Bruce M. McWilliams et al., Appl. Phys. Lett. 43 (10, 946 (1983)].

According to the above technique, however, light emitted from the argon ion laser which is the only light source heats a limited part of the wafer and the gaseous reactants present near the wafer are thermally decomposed by that heat to form a film. Thus, the light acts on the gaseous reactants indirectly; in other words, a direct effect of light on the gas molecules in the gas phase and adsorbed species is not utilized at all and the characteristics of a light-assisted process are not fully utilized. For example, according to the above technique, it is impossible to process the whole surface of the wafer because a finely focused laser beam is used. Moreover, measures are not taken against the adhesion of gas used in the preceding step to the wafer and the inner wall of the reaction chamber.

SUMMARY OF THE INVENTION

It is the object of the present invention to provide an apparatus capable of effecting plural processes such as film deposition and etching for the wafer in a single reaction chamber, eliminating the need of a wafer pre-cleaning step outside the reaction chamber and hence capable of manufacturing a semiconductor device without formation of a natural oxide layer on the wafer surface.

In order to achieve the above object, the semiconductor device manufacturing apparatus of the present invention is characterized by including a reaction chamber, a wafer disposed in the reaction chamber, one or plural light sources for emitting light into the reaction chamber to perform plural processes, a gas introducing means for introducing gases into the reaction chamber, a gas exhaust means for exhausting the gases from the reaction chamber, and a light source for removing by light irradiation undesirable gaseous constituents which adhere to at least one of the wafer and the reaction chamber inner wall.

Thus, a wafer is disposed in a reaction chamber and it is subjected to plural processes in the same reaction chamber under successive radiation of light to the wafer, and after completion of each process, constituents of gaseous reactant which adhere to at least one of the wafer and the inner wall of the reaction chamber are removed by light irradiation.

According to the prior art, after completion of one process, the wafer is taken out of the reaction chamber and its surface is cleaned with a etchant which contains hybrofluoric acid. However, after the cleaning unit placing the wafer into another apparatus for the next processing, there is formed a natural oxide layer on the surface of the wafer. On the other hand, in the present invention, after completion of one process, the wafer surface can be cleaned before starting the next process by light irradiation in the same chamber, so it is possible to prevent the formation of a natural oxide layer on the wafer surface which has heretofore occurred. Consequently, a clean interface can be realized in a semiconductor device and good device characteristics superior in reproducibility can be expected.

DETAILED DESCRIPTION OF PREFERRED EMBODIMENTS

Embodiments of the present invention will be described hereinunder with reference to the accompanying drawings.

Figure 1:
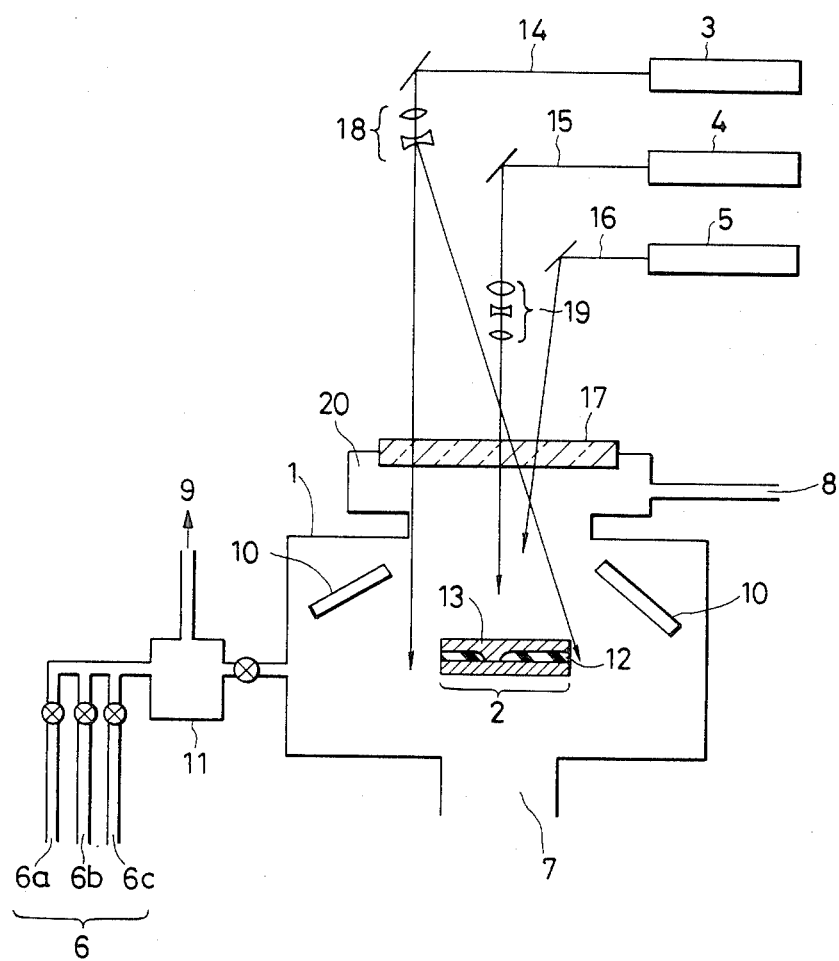
FIG. 1 is a schematic construction diagram of a semiconductor device manufacturing apparatus according to an embodiment of the present invention.

FIG. 1 is a schematic view of a semiconductor device manufacturing apparatus embodying the invention.

In FIG. 1, the numeral 1 denotes a reaction chamber; numeral 2 denotes a wafer to be processed which is disposed within the chamber 1; numerals 3, 4 and 5 denote light sources for emitting light to the wafer 2 to effect different processes by utilization of a photo-assisted reaction; numeral 10 denotes a light source for emitting light to remove residual gaseous constituents which adhere to the surface of the wafer 2 and the inner wall of the vessel 1; and numeral 6 denotes a gas introducing means for introducing gaseous reactants into the chamber 1. Numeral 11 denotes a gas mixing portion for mixing differents kinds of gaseous reactants introduced from 6a, 6b and 6c. Numeral 17 denotes a light transmission window; numeral 20 denotes a room located near the light transmission window 17; numerals 18 and 19 denote optical systems; numerals 7, 8 and 9 denote gas exhausting means for gas exhaustion of the interior of the chamber 1, the room 20 located near the light transmission window 17 and the interior of the gas mixing portion 11, respectively. Other reference numerals will be explained in later-described working examples.

The following description is now provided about working examples for manufacturing a semiconductor device by using the apparatus constructed as above.

EXAMPLE 1

In this Example, the surface of a wafer is subjected to a so-called light etching before allowing a wiring metal to grow according to a photo CVD method, to remove a natural oxide layer present on the wafer, thereby making a good electrical contact between the metal wiring and the underlying layer.

In the semiconductor device manufacturing apparatus shown in FIG. 1, the wafer 2 formed of silicon was disposed within the chamber 1 after completion of a contact perforation to a insulation layer 12.

Then, the chamber 1, the room 20 located near the light transmission window 17 and the gas mixing portion 11 were exhausted to $10^{-7}$ Torr or less, thereafter chlorine gas was introduced from the gas introducing means 6a into the chamber 1 through the gas mixing portion 11 and the chlorine gas pressure was set to 10 Torr. At this time, the flow rate of chlorine gas was 10SCCM. An XeF excimer laser was used as the light source 3 and a laser light 14 was radiated through an optical system 18 to the whole surface of the wafer 2 in the chamber 1. By this photo etching, a natural oxide layer having a thickness of several nm present on the surface of the wafer 2 was removed by its reaction with the chlorine gas and the silicon surface of the contact portion was thereby exposed.

Then, the portions for gas exhaustion were again exhausted to $10^{-7}$ Torr by the gas exhausting means 7, 8 and 9. In this case, a xenon lamp was used as the light source 10 and light was emitted to the surface of the wafer 2 and the inner wall of the chamber 1, thereby promoting the elimination of chlorine gas adsorbed to the wafer surface and the chamber inner wall.

Next, trimethylaluminum ($Al(CH_3)_3$) with nitrogen gas as carrier gas was introduced (pressure: 10 Torr) from the gas introducing means 6 into the chamber 1 through the gas mixing portion 11, and a KrF excimer laser light 16 was emitted to the surface of the wafer 2 from the light source 5. As a result, the $Al(CH_3)_3$ was decomposed and an aluminum layer 13 was deposited on the wafer surface. And $C_nH_m$ as reaction products was discharged from the chamber 1 by the gas exhausting means 7.

Thus, in this Example, on the insulation layer 12 having a contact hole on the silicon wafer 2 there could be formed the aluminum layer 13 without interposition of a natural oxide layer at the contact portion. Consequently, a semiconductor device superior in electrical contact between the silicon wafer 2 and the aluminum layer 13 could be manufactured.

It is desirable that a poisonous gas collecting apparatus, for example, a cleaning apparatus such as a scrubber, be provided after the gas exhausting means 7, 8 and 9 to remove any poisonous gas produced before discharge into the air.

EXAMPLE 2

In this Example, a selective etching is performed using a focused laser light and thereafter a film is deposited on the whole surface of a wafer.

In the semiconductor device manufacturing apparatus shown in FIG. 1, a silicon wafer (not shown) with a phosphosilicate glass (PSG) layer formed on the surface was disposed within the chamber 1 and the portions for gas exhaustion were exhausted to $10^{-8}$ Torr by the gas exhausting means 7, 8 and 9.

Thereafter, methyl fluoride gas ($CH_3F$) was introduced (pressure: 1 Torr) into the chamber 1 from the gas introducing means 6a. An $F_2$ excimer laser light (wavelength: 157 nm) was used as the light source 4 and light which had been focused to a diameter of 1 $\mu$m by the optical system 19 was directed to a predetermined position of the wafer to etch the PSG layer present on the wafer surface thereby allowing a desired portion of the silicon surface to be exposed.

Then, the interior of the chamber 1 was exhausted to $10^{-8}$ Torr and thereafter $Al(CH_3)_3$ was introduced (pressure: 1 Torr) in the same way as in Example 1. At this time, if a residual gas of the $CH_3F$ used in the preceding step is present, there will be formed an adsorbed layer of hydrocarbon on the exposed silicon surface, thus resulting in a poor electrical contact between the silicon and the aluminum layer to be next formed on the wafer. Therefore, before introducing $Al(CH_3)_3$, the adsorbed gas was removed by light irradiation to the wafer using a xenon lamp as the light source.

Then, the KrF excimer laser light 14 was radiated to the whole surface of the wafer from the light source 3 through the optical system 18 to allow aluminum layer to be deposited on the wafer surface.

In this Example, in forming a contact hole the PSG layer can be removed completely without contamination of the silicon surface of the contact hole portion, therefore good contact characteristics could be attained.

EXAMPLE 3

In this Example, after film deposition on the whole wafer surface, a predetermined portion of the film is etched.

In the semiconductor manufacturing apparatus shown in FIG. 1, monosilane ($SiH_4$) from the gas introducing means 6a and nitrogen oxide ($N_2O$) from the gas introducing means 6b were mixed [$SiH_4$: $N_2O$ = 1:4 (volume ratio)] in the gas mixing portion 11 and then the gaseous mixture was introduced (pressure: 0.1 Torr) into the chamber 1 held at a high vacuum of $10^{-8}$ Torr.

Then, using an ArF excimer laser as the light source 3, the laser light 14 was directed to the whole surface of the silicon wafer disposed in the chamber 1 to form a silicon dioxide film.

Then, the portions for gas exhaustion were exhausted to $10^{-8}$ Torr by the gas exhausting means 7, 8 and 9, thereafter chlorine gas as an etching gas was introduced (pressure: 10 Torr) from the gas introducing means 6c, and using an XeF excimer laser as the light source 4, light was focused to a diameter of 1 $\mu$m through the optical system 19 and then directed to the silicon dioxide film, whereby a hole having a diameter of 1 $\mu$m was formed thereby allowing the silicon surface to be exposed.

Thus, in this Example, deposition and etching of a desired film are performed in the same chamber and hence not influenced by the outside air and an extra process of cleaning outside the chamber is not needed, thus resulting in that a semiconductor device having good characteristics could be manufactured.

EXAMPLE 4

In this Example, after etching using a photoresist mask, the resist layer is removed and the wafer surface is cleaned by photo etching, followed by further deposition of film.

Figure 2A:
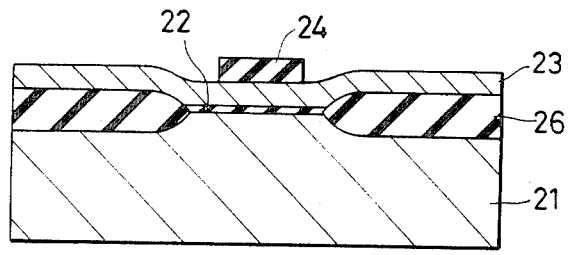
FIGS. 2A, 2B and 2C are sectional views showing an example of a manufacturing process for a semiconductor device manufactured by the apparatus of the invention.
Figure 2B:
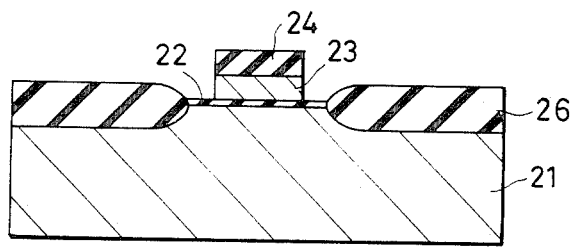
Figure 2C:
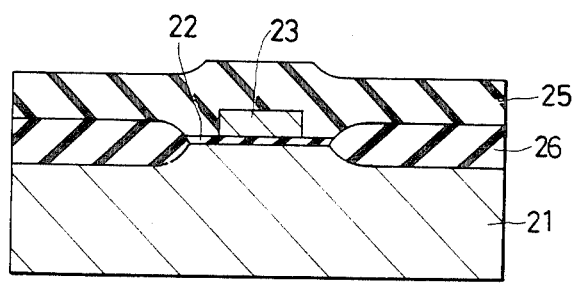

FIGS. 2A to 2C are sectional views showing a semiconductor manufacturing process in this Example.

FIG. 2A shows a structure having a p-type (100) plane 10 $\Omega$·cm silicon substrate 21 with an element isolation region 26 of silicon oxide film formed thereon, a 20 nm thick gate oxide film 22 formed on the silicon substrate 21 by dry oxidation, a gate conductor layer 23 formed of aluminum on the gate oxide film 22, and a photoresist pattern formed on the gate conductor layer 23.

In FIG. 2B, using the semiconductor device manufacturing apparatus shown in FIG. 1, the wafer was disposed in the chamber 1 and the gate conductor layer 23 was etched by a photo-assisted reaction with the photoresist pattern 24 as a mask. $XeF_2$ was used as a gaseous reactant, the pressure was set to about 0.1 Torr, and a $CO_2$ laser was used as the light source 4.

In FIG. 2C, using oxygen ($O_2$) as a gaseous reactant (pressure: 1 Torr) again in the same chamber 1, the photoresist pattern 24 was removed by a photo-assisted reaction using the ArF excimer laser light source 3, then the surface layer was photo-etched in a chlorine gas atmosphere (pressure: 10 Torr) by means of the xenon lamp light source 10 and these gaseous reactants were removed in a high vacuum ($10^{-8}$ Torr); further, a gaseous mixture (pressure: 5 Torr) of $SiH_4$, $PH_3$ and $N_2O = 1:4:4$ (volume ratio) was introduced and ArF excimer laser light was radiated from the light source 5 to allow a PSG film 25 to be deposited as a passivation film.

Thus, in this Example, even a material used halfway in the process and not a structural material of a semiconductor device is also removed like the photoresist removal and thereafter the wafer surface and the inner wall of the chamber are cleaned by means of the light source 10. As a result, a semiconductor device having good device characteristics could be manufactured.

Although in the embodiment illustrated in FIG. 1, the light source 10 is disposed within the chamber 1, it may be provided outside the chamber 1. But disposing the light source 10 within the chamber 1 is advantageous in that the light from the light source 10 can be easily radiated throughout the interior of the chamber 1. Further, although Xe lamp was used as the light source 10, there may be used Hg lamp, Hg-Xe lamp or D lamp if only the wave length of emitted light is of an ultraviolet region. It is desirable that the constituents of gaseous reactant adhered to both the wafer 2 and the chamber inner wall be by removed light irradiation from the light source 10. But as the case may be, the object can be attained even by removing gaseous constituents adhered to only one of them.

According to the present invention, as set forth hereinabove, it becomes possible to perform in the same chamber a plurality of processes such as film deposition and etching by the photo-excitation technique. After completion of one process, the wafer surface is cleaned without being exposed to the outside air and then the next process can be carried out. Therefore, it is possible to eliminate the influence of a so-called natural oxide layer and create a complete interface. Moreover, since the residual gaseous constituents adhered to the inner wall of the chamber are removed at every processing, it is possible to eliminate its bad influence and hence it is possible to attain good device characteristics superior in reproducibility. Further, the manufacturing time can be reduced because unlike the prior art it is not required to effect cleaning of wafer outside the reaction chamber.

Thus, the effects of the present invention are extremely outstanding.

What is claimed is:

1. A semiconductor device manufacturing apparatus comprising:
    a reaction chamber;
    a first light source means having at least one first light source for radiating light to a wafer disposed in said reaction chamber to induce photo-assisted reactions for performing a plurality of processes;
    a gas introducing means for introducing gaseous reactants into said reaction chamber;
    a gas exhausting means for exhausting the interior of said reaction chamber; and
    a second light source means for removing by light irradiation undesirable gaseous constituents which adhere to said wafer and an inner wall of said reaction chamber.

2. A semiconductor device manufacturing apparatus according to claim 1, wherein said second light source means has at least one second light source which is disposed within said reaction chamber.

3. A semiconductor device manufacturing apparatus according to claim 1, wherein said second light source means emits light having a wave length of an ultraviolet region.

4. A semiconductor device manufacturing apparatus according to claim 3, wherein said second light source means is a xenon lamp.

5. A semiconductor device manufacturing apparatus according to claim 2, wherein the second light source means is a light source means for emitting light to strike the inner wall of said reaction chamber thereby to remove undesirable gaseous constituents which adhere to said inner wall of said reaction chamber.

6. A semiconductor device manufacturing apparatus according to claim 2, wherein the second light source means is a light source means for emitting light to strike the surface of the wafer and to strike said inner wall of said reaction chamber thereby to remove undesirable gaseous constituents which adhere to said wafer and said inner wall of said reaction chamber.

7. A semiconductor device manufacturing apparatus according to claim 1, wherein the second light source means is a light source means for emitting light to strike the inner wall of said reaction chamber thereby to remove undesirable gaseous constituents which adhere to said inner wall of said reaction chamber.

8. A semiconductor device manufacturing apparatus according to claim 1, wherein the second light source means is a light source means for emitting light to strike the surface of the wafer and to strike said inner wall of said reaction chamber thereby to remove undesirable gaseous constituents which adhere to said wafer and said inner wall of said reaction chamber.

* * * * *